(12) United States Patent
Tomasi (10) Patent No.: US 7,276,962 B1
(45) Date of Patent: Oct. 2, 2007

(54) CIRCUIT TOPOLOGY FOR REDUCED HARMONIC DISTORTION IN A SWITCHED-CAPACITOR PROGRAMMABLE GAIN AMPLIFIER

(75) Inventor: Loren Justin Tomasi, Chandler, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 128 days.

(21) Appl. No.: 11/283,915

(22) Filed: Nov. 21, 2005

(51) Int. Cl.
*H03F 1/02* (2006.01)
(52) U.S. Cl. .......................................... 330/9; 330/254
(58) Field of Classification Search ................ 327/124, 327/554
See application file for complete search history.

(56) References Cited

U.S. PATENT DOCUMENTS 6,661,283 B1* 12/2003 Lee ................................ 330/9
6,853,241 B2* 2/2005 Fujimoto ....................... 330/9
2005/0212591 A1* 9/2005 Temes et al. ............... 327/554

OTHER PUBLICATIONS

Abo, Andrew M. et al., "A 1.5-V, 10-bit, 14.3-MS/s CMOS Pipeline Analog-to-Digital Converter," *IEEE Journal of Solid-State Circuits*, 1999, (pp. 599-606).
Kang, Chih-Kai et al., "A 10-bit 10 MHz Samples/s 5mW Successive approximation Register A/D converter,"Dec. 2002, University of Michigan Design Contest, (pp. 1-6).

* cited by examiner

*Primary Examiner*—Steven J. Mottola
(74) *Attorney, Agent, or Firm*—Brett A. Hertzberg; Merchant & Gould PC (57) ABSTRACT

A switched-capacitor programmable gain amplifier (PGA) has improved circuit performance that avoids impracticably small capacitors, while providing low total harmonic distortion (THD) and reasonable gain linearity. The sampling capacitor (CS) in the PGA is designed with a C-2C capacitor array. Gain settings from the C-2C capacitor array arranged for selection with constant VGS switches. The gain of the resulting PGA corresponds to the ratio of the effective capacitance of the C-2C array and the effective capacitance value of the feedback capacitor (CF). The resulting performance of the PGA has reduced charge injection and clock feed-through errors, and thus reduced THD.

18 Claims, 8 Drawing Sheets

CIRCUIT TOPOLOGY FOR REDUCED HARMONIC DISTORTION IN A SWITCHED-CAPACITOR PROGRAMMABLE GAIN AMPLIFIER

FIELD OF THE INVENTION

The present invention generally relates to signal processing applications. More particularly, the present invention is related to a circuit, system, and method for reducing the harmonic distortion in a switched capacitor type programmable gain amplifier.

BACKGROUND

A programmable gain amplifier (PGA) is employed in many signal processing applications where adjustable signal gain is required. Example applications include audio signal processing, video signal processing, image processing, and control systems, to name a few. In one example, an adjustable volume level can be provided in an audio system by gain scaling signals in the pre-amplifier with a PGA. In another example, an image sensor is arranged to work with a PGA such that the PGA provides gain scaling of the signals from the sensor such as in a CDS (Correlated Double Sampling) circuit arrangement.

The described analog signal processing applications may utilize a PGA that is capable of amplifying a wide range of analog input signals. The PGA may also require fine control over the gain that is applied to the analog input signal. As target resolutions and operating speeds increase various non-ideal effects in the circuits may result in undesirable performance. The present disclosure contemplates a variety of non-ideal effects in switched capacitor PGA circuits.

BRIEF DESCRIPTION OF THE DRAWINGS

Non-limiting and non-exhaustive embodiments are described with reference to the following drawings.

DETAILED DESCRIPTION OF THE PREFERRED EMBODIMENT

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, data, or other signal.

Briefly stated, a switched-capacitor programmable gain amplifier (PGA) has improved circuit performance that avoids impracticably small capacitors, while providing low total harmonic distortion (THD) and reasonable gain linearity. The sampling capacitor (CS) in the PGA is designed with a C-2C capacitor array. Gain settings from the C-2C capacitor array arranged for selection with constant VGS switches. The gain of the resulting PGA corresponds to the ratio of the effective capacitance of the C-2C array and the effective capacitance value of the feedback capacitor (CF). The resulting performance of the PGA has reduced charge injection and clock feed-through errors, and thus reduced THD.

Figure 1:
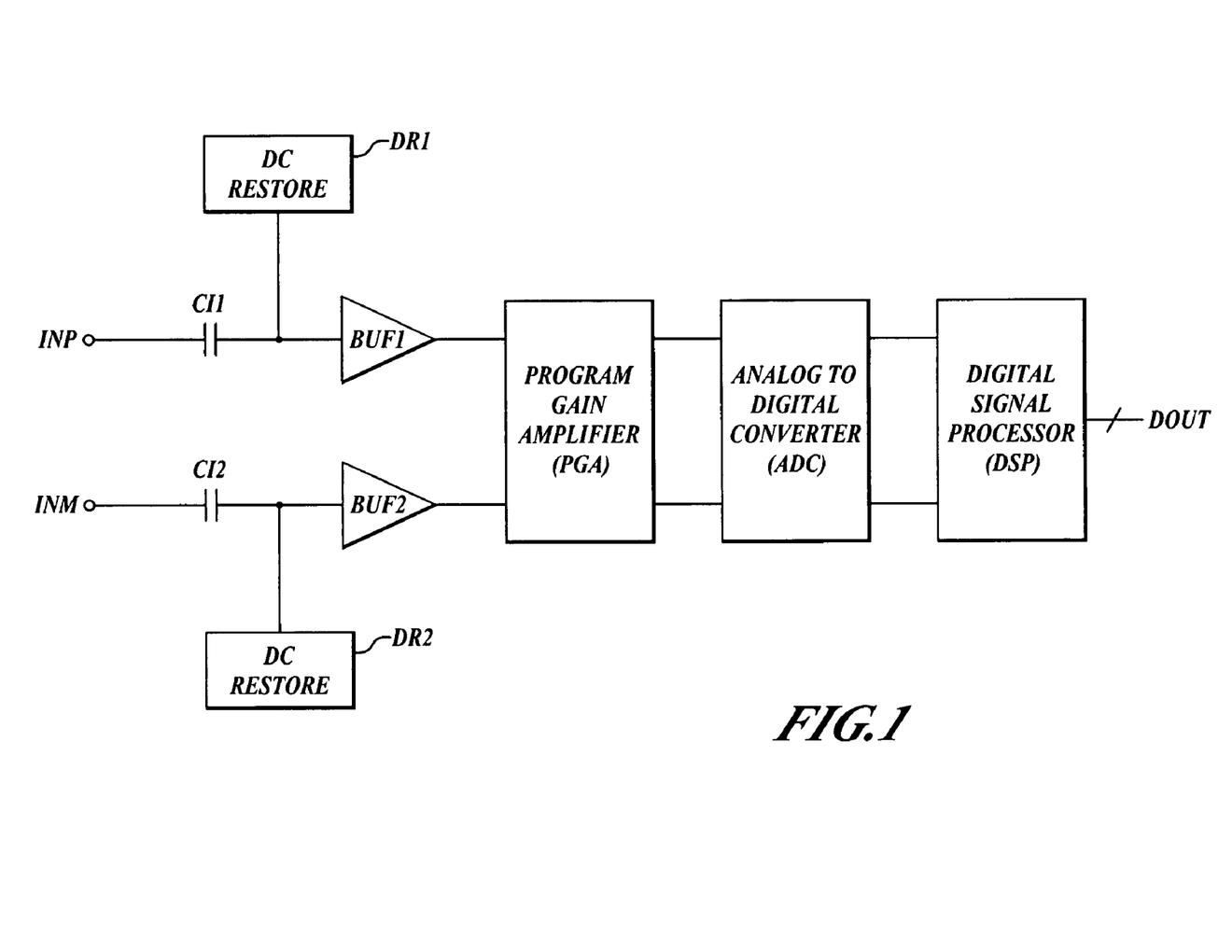
FIG. 1 is a schematic diagram of a video signal processing circuit that employs a switched capacitor PGA in accordance with the present disclosure.

FIG. 1 is a schematic diagram of a video signal processing circuit that employs a switched capacitor PGA circuit in accordance with the present disclosure. The video signal processing circuit includes: two capacitors (CI1, CI2), two buffers (BUF1, BUF2), two DC restore circuits (DR1, DR2), a programmable gain amplifier (PGA), an analog-to-digital converter (ADC), and a digital signal processor (DSP).

A video signal is applied across two input terminals (INP, INM), which are arranged to ac couple the input signal to the input of the buffer circuits via capacitors CI1 and CI2. The dc restore circuits (DR1, DR2) are arranged to adjust the DC voltage levels at the input of the buffers (BUF1, BUF2), which provide buffering of the ac coupled input signals to the inputs of the PGA. The PGA increases the signal amplitudes of the buffered input signals according to a selected gain factor, which is determined by a switched capacitor circuit that is specially designed to reduce distortion as will be described later. The output of the PGA is coupled to the ADC, which is arranged to convert the gain scaled signals from the output of the PGA into digital values. The DSP is arranged to process the digital values from the ADC to provide any desired signal processing function such as color balancing, dithering, filtering, etc. The selected gain factor in the PGA can be optimally selected to cover the full dynamic range of the ADC.

Figure 2A:
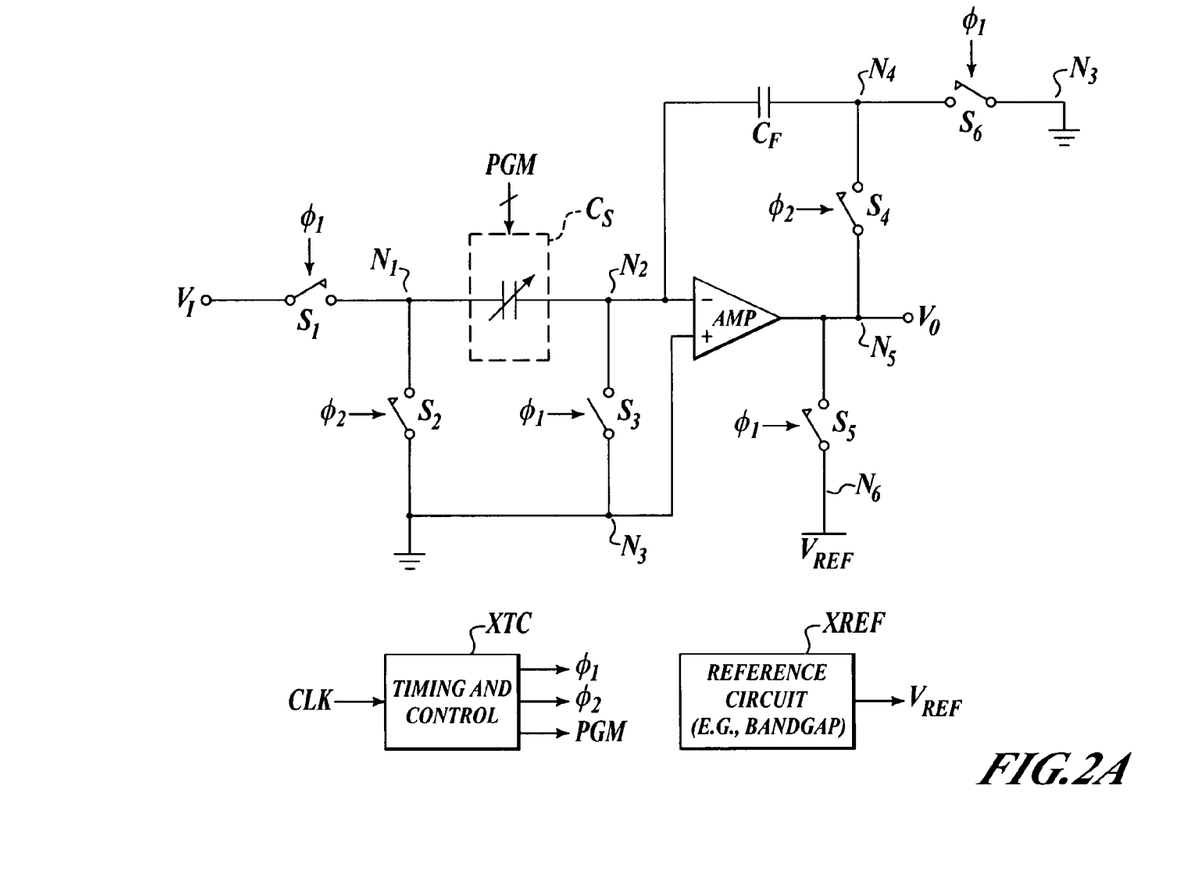
FIG. 2A is a schematic diagram of a single ended switched capacitor PGA circuit in accordance with the present disclosure.

FIG. 2A is a schematic diagram of a single ended switched capacitor PGA circuit in accordance with the present disclosure. The switched capacitor PGA includes a differential amplifier (AMP) circuit, six switching circuits (S1 through S6), a sampling capacitor circuit (CS) and a feedback capacitor circuit (CF).

The differential amplifier (AMP) circuit includes a non-inverting input terminal, an inverting input terminal and an output terminal. The inverting input terminal of the differential amplifier (AMP) circuit is coupled to node N2. The non-inverting input terminal of the differential amplifier (AMP) circuit is coupled to node N3. The output terminal of the differential amplifier (AMP) circuit is coupled to node N5. The differential amplifier (AMP) circuit is thus arranged to provide an output signal (VO) at node N5 that is responsive to the voltage applied across nodes N2 and N3. Node N3 is coupled to a predetermined voltage such as VSS, GND, VMID, VCM, or VREF, to name a few.

The sampling capacitor circuit (CS) is coupled between nodes N1 and N2, and is arranged to provide a sampling capacitance value between nodes N1 and N2 that is responsive to a program control signal (PGM). The feedback capacitor circuit (CF) is coupled between nodes N2 and N4, and is arranged to provide a feedback capacitance value between nodes N2 and N4. The overall gain of the PGA circuit is determined by the values associated with the feedback and sampling capacitors. The sampling capacitance value is determined according to a switched capacitor circuit that is arranged in accordance with embodiments of the invention that will be described further below. The feedback capacitance value can be a fixed value, or an adjustable value similar to the sampling capacitor circuit.

Switching circuit S1 is arranged to selectively couple an input signal (VI) to node N1 in response to a first control signal ($\phi1$). Switching circuit S2 is arranged to couple node N1 to the predetermined voltage at node N3 in response to a second control signal ($\phi2$). Switching circuit S3 is arranged to selectively couple node N2 to the predetermined voltage at node N3 in response to the first control signal ($\phi1$). Node N4 is selectively coupled to the predetermined voltage at node N3 via switching circuit S6, which is responsive to the first control signal ($\phi1$). Node N4 can also be selectively coupled to the output of the differential amplifier (AMP) at node N5 via switching circuit S4, which is responsive to the second control signal ($\phi2$). Switching circuit S5 can be arranged to couple node N5 to a known voltage at node N6 in response to the first control signal ($\phi1$). The known voltage at node N6 can either be the same as the predetermined voltage at node N3, or different from the voltage at node N3 such as from a reference circuit that provides a reference voltage (VREF).

A timing and control circuit (XTC) and a reference circuit (XREF) can be arranged to provide the various control signals (PGM), timing signals ($\phi1$, $\phi2$), and reference signals (VREF) that are necessary for the operation of the single-ended switched capacitor PGA. The PGA is configured to operate in two operational phases: sampling phase, and amplification phase. During the sampling phase, control signal (P1 is asserted, the input signal (VI) is stored on the sampling capacitor, the feedback capacitor circuit (CF) is discharged to the predetermined voltage at node N3), and the output of the differential amplifier (AMP) circuit is defined by the voltage at node N6. During the amplification phase, control signal $\phi2$ is asserted, the stored charge on capacitor circuit CS is redistributed with the feedback capacitor, and the differential amplifier (AMP) circuit is arranged to provide current to/from node N4 such that the amplified signal is provided at node N5 as signal VO.

Figure 2B:
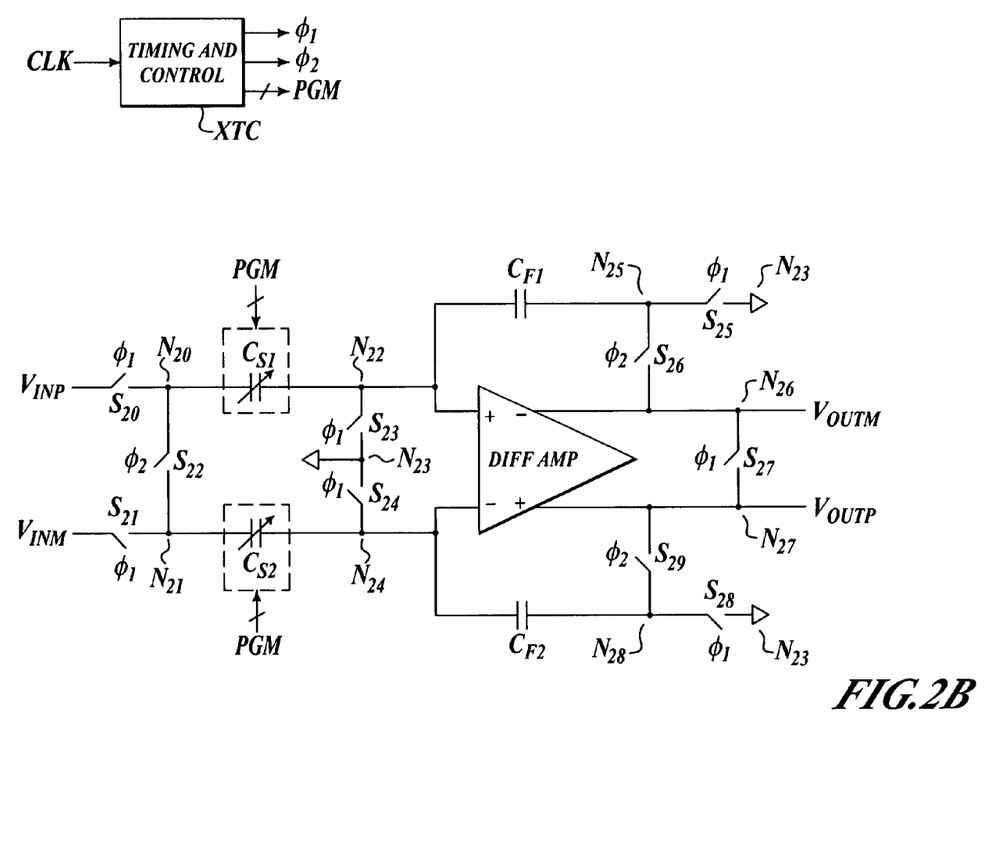
FIG. 2B is a schematic diagram of a differential switched capacitor PGA circuit in accordance with the present disclosure.

FIG. 2B is a schematic diagram of a differential switched capacitor PGA circuit in accordance with the present disclosure. The differential switched capacitor PGA circuit includes a fully-differential amplifier (DIFF AMP) circuit, nine switching circuits (S21 through S29), two sampling capacitor circuits (CS1, CS2) and two feedback capacitor circuits (CF1, CF2).

The differential amplifier (DIFF AMP) circuit includes a non-inverting input terminal, an inverting input terminal, a non-inverting output terminal, and an inverting output terminal. The inverting input terminal of the differential amplifier (DIFF AMP) circuit is coupled to node N22. The non-inverting input terminal of the differential amplifier (DIFF AMP) circuit is coupled to node N24. The non-inverting output terminal of the differential amplifier (DIFF AMP) circuit is coupled to node N27. The inverting output terminal of the differential amplifier (DIFF AMP) circuit is coupled to node N26. The differential amplifier (AMP) circuit is thus arranged to provide an output signal (VO) across nodes N27 and N26 that is responsive to the voltage applied across nodes N22 and N24.

The first sampling capacitor circuit (CS1) is coupled between nodes N20 and N22, and is arranged to provide a first sampling capacitance value there between that is responsive to a program control signal (PGM). Similarly, the second sampling capacitor circuit (CS2) is coupled between nodes N21 and N24, and is arranged to provide a second sampling capacitance value there between that is responsive to the program control signal (PGM). The first feedback capacitor circuit (CF1) is coupled between nodes N22 and N25, and is arranged to provide a first feedback capacitance value there between. Similarly, the second feedback capacitor circuit (CF2) is coupled between nodes N24 and N28, and is arranged to provide a second feedback capacitance value there between. The overall gain of the PGA circuit is determined by the values associated with the feedback and sampling capacitors, similar to that previously described for FIG. 2A. The sampling capacitance values are determined according to switched capacitor circuits that are arranged in accordance with embodiments of the invention that will be described further below. The feedback capacitance values can be fixed values, or adjustable values similar to the sampling capacitor circuits.

Switching circuits S20 and S21 are arranged to selectively couple one of the input signals (VINP, VINM) to a respective one of nodes N20 and N21 in response to a first control signal ($\phi1$). Switching circuit S22 is arranged to couple node N20 to node N21 in response to a second control signal ($\phi2$) such that there is no difference present at the input side of the sampling capacitors. Switching circuits S23 and S24 are arranged to selectively couple nodes N22 and N24 to node N23 in response to the first control signal ($\phi1$). Node N23 corresponds to a predetermined voltage such as, for example, VREF. VDD, VSS, VMID, VCM, GND, etc. Node N25 is selectively coupled to the predetermined voltage at node N23 via switching circuit S25, which is responsive to the first control signal ($\phi1$). Node N25 can also be selectively coupled to the inverting output of the differential amplifier (DIFF AMP) at node N26 via switching circuit S26, which is responsive to the second control signal ($\phi2$). Node N28 is selectively coupled to the predetermined voltage at node N23 via switching circuit S28, which is responsive to the first control signal ($\phi1$). Node N28 can also be selectively coupled to the non-inverting output of the differential amplifier (DIFF AMP) at node N27 via switching circuit S29, which is responsive to the second control signal ($\phi2$). Switching circuit S27 is arranged to selectively couple node N26 to node N27 in response to the first control signal ($\phi1$).

A timing and control circuit (XTC) can be arranged to provide the various control signals (PGM) and timing signals ($\phi1$, $\phi2$) that are necessary for the operation of the fully-differential switched capacitor PGA. The PGA is configured to operate in two operational phases: sampling phase, and amplification phase. During the sampling phase, control signal φ1 is asserted, the input signals (VIP, VINM) are stored on their respective sampling capacitors (CS1, CS2), the feedback capacitor circuits (CF1, CF2) are discharged to the predetermined voltage at node N23, and the output of the differential amplifier (DIFF AMP) circuit is initialized to have no differential output signal. During the amplification phase, control signal φ2 is asserted, the stored charge on capacitor circuits CS1 and CS2 are redistributed with the feedback capacitors (CF1, CF2), and the differential amplifier (DIFF AMP) circuit is arranged to provide current to/from nodes N25 and N28 such that the amplified signal is provided across nodes N26 and N27 as signals VOUTP, VOUTM.

Figure 3A:
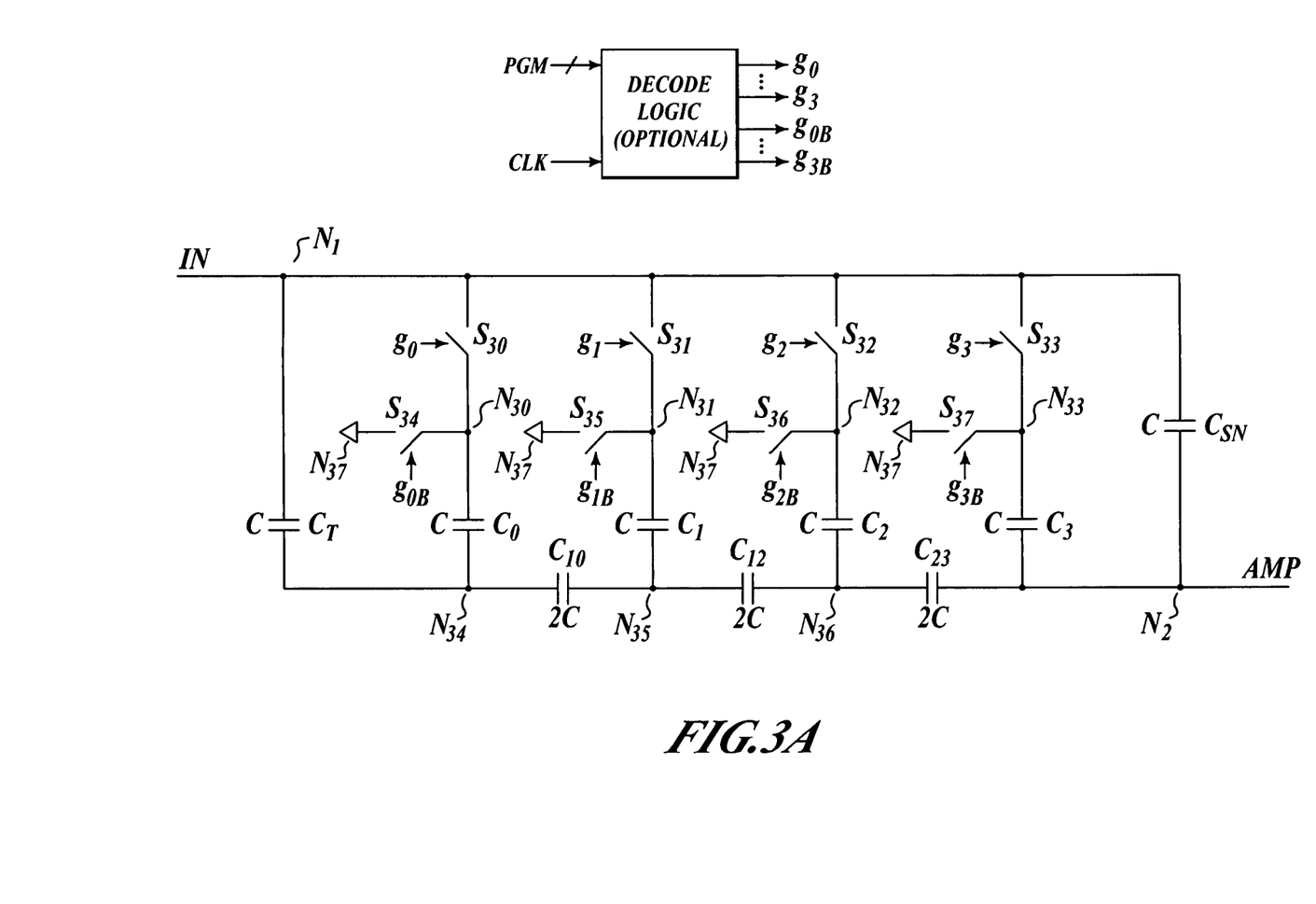
FIGS. 3A and 3B are schematic diagrams of programmable sampling capacitor circuit arrangements in accordance with the present disclosure.
Figure 3B:
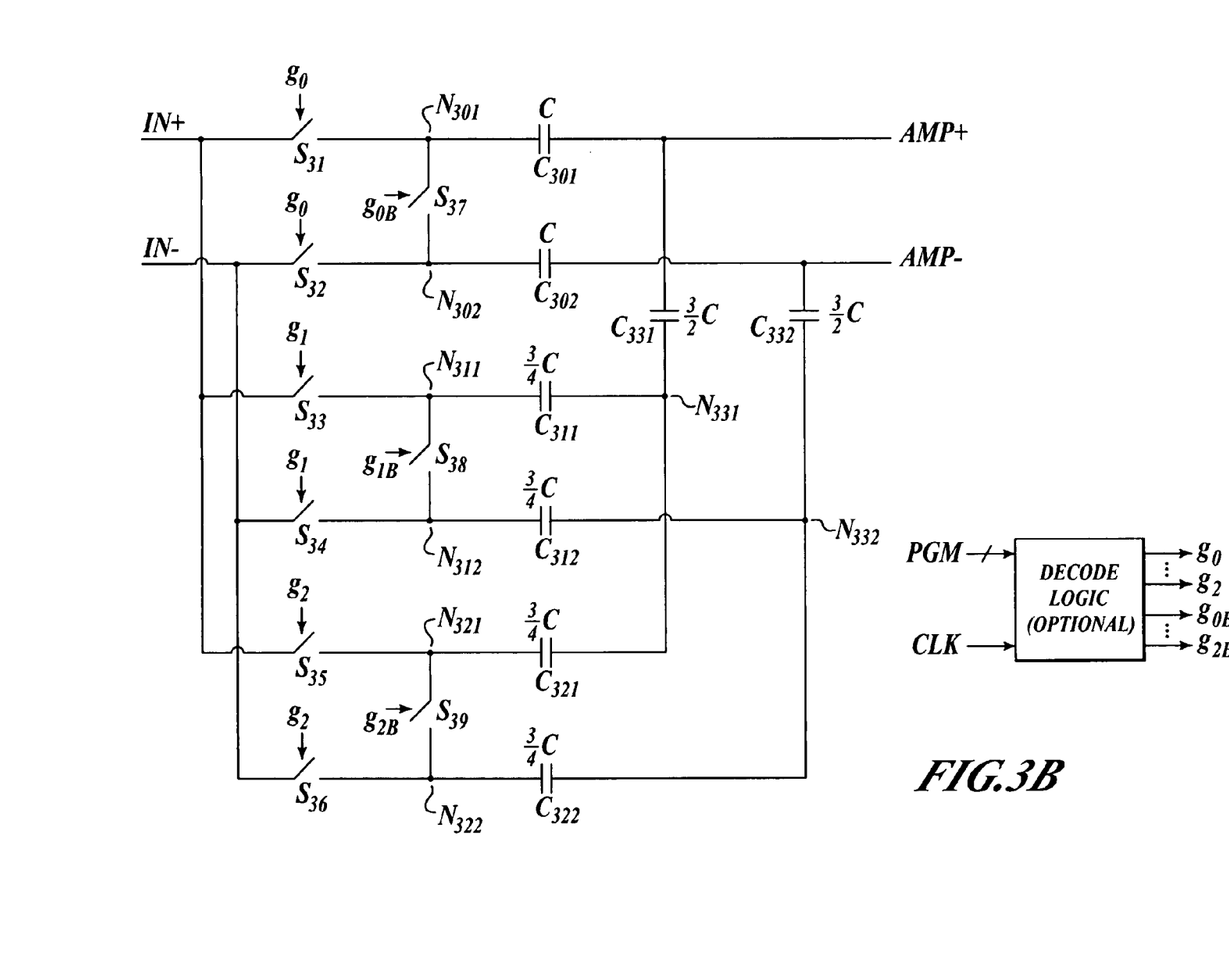

FIGS. 3A and 3B are schematic diagrams of programmable sampling capacitor circuit arrangements in accordance with the present disclosure. As previously stated, the gain of each described PGA circuit is determined by the ratio of the sampling capacitor (CS) to the feedback capacitor (CF).

For FIG. 3A, each sampling capacitor circuit (e.g., CS) is digitally programmable and is implemented with a C-2C scheme including: nine capacitor circuits (CT, CSN, C0-C3, C10, C12 and C23) and eight switching circuits (S30-S37).

Capacitor circuit CT is coupled between node N1 and node N34, and has a capacitance value of "C". Capacitor circuit CSN is coupled between node N1 and node N2. Capacitor circuit C0 is coupled between node N30 and node N34, and has a capacitance value of "C". Capacitor circuit C1 is coupled between node N31 and node N35, and has a capacitance value of "C". Capacitor circuit C2 is coupled between node N32 and node N36, and has a capacitance value of "C". Capacitor circuit C3 is coupled between node N33 and node N2, and has a capacitance value of "C". Capacitor circuit C10 is coupled between node N34 and node N35, and has a capacitance value of "2C". Capacitor circuit C12 is coupled between node N35 and node N36, and has a capacitance value of "2C". Capacitor circuit C23 is coupled between node N36 and node N2, and has a capacitance value of "2C".

Switching circuit S30 is coupled between node N30 and node N1, and is responsive to control signal g0. Switching circuit S31 is coupled between node N31 and node N1, and is responsive to control signal g1. Switching circuit S32 is coupled between node N32 and node N1, and is responsive to control signal g2. Switching circuit S33 is coupled between node N33 and node N1, and is responsive to control signal g3. Switching circuit S34 is coupled between node N30 and node N37, and is responsive to inverse control signal g0B. Switching circuit S35 is coupled between node N31 and node N37, and is responsive to inverse control signal g1B. Switching circuit S36 is coupled between node N32 and node N37, and is responsive to inverse control signal g2B. Switching circuit S37 is coupled between node N33 and node N37, and is responsive to inverse control signal g3B. Node N37 corresponds to a predetermined voltage that may be any one of: a circuit ground (e.g., GND), a power supply voltage (e.g., VDD, VSS, etc.), a mid-supply voltage (e.g., VMID), and a common-mode voltage (e.g., VCM) for an amplifier circuit.

Each sampling capacitor circuit is arranged to selectively adjust the effective capacitance between nodes N1 and N2 in response to control signals g0-g3 and inverse control signals g0B-g3B. The control signals may be provided by an optional decode logic circuit that receives a program control signal (e.g., PGM) and a clock signal (CLK). Each control signal pair (e.g., g0 and g0B) is arranged to control the selection of a respective one of the capacitor circuits (e.g., C0). For example, capacitor circuit C3 can be selectively coupled in parallel with capacitor CSN by selective activation of switching circuit S33 via control signal g3 such that the capacitance of CS is increased from CSN to CSN+"C". Capacitor CT is a terminating capacitor for the C-2C array such that the capacitance values are predictable and easily calculated.

As stated previously, the gain of the PGA circuit is determined by the ratio of the sampling capacitor (CS) to the feedback capacitor (CF). The sampling capacitor (CS) is digitally programmable and is implemented with a C-2C scheme (e.g., the 4-bit C-2C array illustrated in FIG. 3A). The C-2C scheme allows minimal effective capacitance, which is critical for high-speed operation, without having to implement impractically small integrated capacitors (currently on the order of approximately 10 fF or less) and yet maintains reasonable gain linearity.

An example 4 bit C-2C array may have the following values: CF=500 fF, CSN=500 fF, and a unit capacitor "C" value of 250 fF. For this example, the minimum value of the sampling capacitor (CSMIN) corresponds to the value of CSN or 500 fF, and the maximum value of the sampling capacitor ($CS_{MAX}$) corresponds to the value of $C_{SN}$+"2C" or 1000 fF. One least significant bit (LSB) of the sampling capacitor is given as $CS_{LSB}=(CS_{MAX}-CS_{MIN})/2^4=31.25$ fF. The gain associated with each LSB is thus given by: $GAIN_{LSB}=CS_{LSB}/CS_{MIN}=31.25$ fF/500 fF=0.0625 V/V. The following table illustrates various values associated with an example 4 bit C-2C array.

| PGA Setting | PGA Cs (fF) | PGA Cf (fF) | PGA Gain |
| --- | --- | --- | --- |
| 0000 | 531.25 | 500.00 | 1.0625 |
| 0001 | 562.50 | 500.00 | 1.1250 |
| 0010 | 593.75 | 500.00 | 1.1875 |
| 0011 | 625.00 | 500.00 | 1.2500 |
| 0100 | 656.25 | 500.00 | 1.3125 |
| 0101 | 687.50 | 500.00 | 1.3750 |
| 0110 | 718.75 | 500.00 | 1.4375 |
| 0111 | 750.00 | 500.00 | 1.5000 |
| 1000 | 781.25 | 500.00 | 1.5625 |
| 1001 | 812.50 | 500.00 | 1.6250 |
| 1010 | 843.75 | 500.00 | 1.6875 |
| 1011 | 875.00 | 500.00 | 1.7500 |
| 1100 | 906.25 | 500.00 | 1.8125 |
| 1101 | 937.50 | 500.00 | 1.8750 |
| 1110 | 968.75 | 500.00 | 1.9375 |
| 1111 | 1000.00 | 500.00 | 2.0000 |

Each PGA setting corresponds to one of the possible sixteen ($2^4$) settings associated with the sampling capacitor (CS) control signals g0-g4.

For FIG. 3B, each sampling capacitor (e.g., CS) is digitally programmable and is implemented with a modified C-2C scheme. The modified C-2C array includes: eight capacitor circuits and nine switching circuits.

A first capacitor circuit (C301) is selectively coupled between IN+ and AMP+ via switching circuit S31 in response to control signal g0. A second capacitor circuit (C302) is selectively coupled between IN− and AMP− via switching circuit S32 in response to control signal g0. Switching circuit S37 is arranged to couple the first and second capacitor circuit (C301, C302) together in response to a first inverse control signal (g0B). The first and second capacitor circuits each have a capacitance value corresponding to "C".

A first intermediate capacitor with a value of "3/2*C" is coupled between AMP+ and a first intermediate node. A second intermediate capacitor with a value of "3/2*C" is coupled between AMP− and a second intermediate node.

A third capacitor circuit (C311) is selectively coupled between IN+ and the first intermediate node via switching circuit S33 in response to control signal g1. A fourth capacitor circuit (C312) is selectively coupled between IN− and the second intermediate node via switching circuit S34 in response to control signal g1. Switching circuit S38 is arranged to couple the third and fourth capacitor circuits (C311, C312) together in response to a second inverse control signal (g1B). The third and fourth capacitor circuits each have a capacitance value corresponding to "3/4*C".

A fifth capacitor circuit (C321) is selectively coupled between IN+ and the first intermediate node via switching circuit S35 in response to control signal g2. A sixth capacitor circuit (C322) is selectively coupled between IN− and the second intermediate node via switching circuit S36 in response to control signal g2. Switching circuit S37 is arranged to couple the fifth and sixth capacitor circuits (C321, C322) together in response to a third inverse control signal (g2B). The fifth and sixth capacitor circuits each have a capacitance value corresponding to "3/4*C".

The various switching circuits for FIGS. 2A and 2B can be implemented with CMOS transmission gates, single NMOS devices, or any other circuit combination provided that there is sufficient headroom to allow proper operation. Conventional switching arrangements suffer from several non-idealities that can create problems in the overall operation of the PGA. Charge injection and clock feed-through are noteworthy in particular because these effects are dependent upon the input signal and can result in distortion in the amplified signals.

Figure 4:
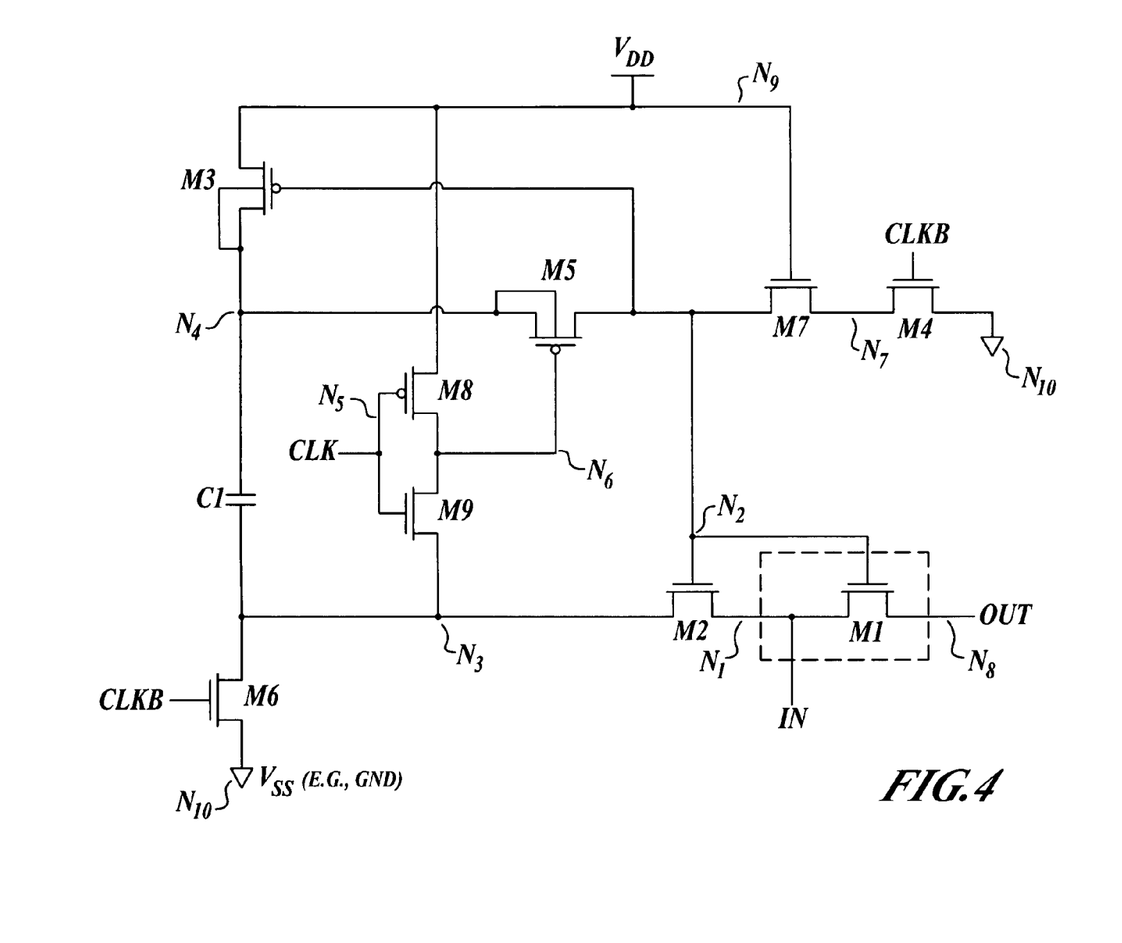
FIG. 4 is a schematic diagram of a constant VGS switch circuit in accordance with the present disclosure.

FIG. 4 is a schematic diagram of a constant VGS switch circuit in accordance with the present disclosure. The constant VGS switch circuit arrangement eliminates many non-ideal effects such as clock-feed-through and input dependencies, which can result in increased distortion. Each constant VGS switch circuit includes a capacitor circuit (C1) and nine transistors (M1-M9).

Transistor M1 is coupled between nodes N1 and N8, and includes a gate terminal that is coupled to node N2. Transistor M2 is coupled between nodes N1 and N3, and includes a gate terminal that is coupled to node N2. Transistor M3 is coupled between nodes N9 and N4, and includes a gate terminal that is coupled to node N2. Transistor M4 is coupled between nodes N7 and N10, and includes a gate terminal that is coupled to CLKB. Transistor M5 is coupled between nodes N2 and N4, and includes a gate terminal that is coupled to node N6. Transistor M6 is coupled between nodes N3 and N10, and includes a gate terminal that is coupled to CLKB. Transistor M7 is coupled between nodes N2 and N7, and includes a gate terminal that is coupled to node N9. Transistor M8 is coupled between nodes N9 and N6, and includes a gate terminal that is coupled to CLK. Transistor M9 is coupled between nodes N6 and N3, and includes a gate terminal that is coupled to CLK. Capacitor C1 is coupled between nodes N4 and N3.

In operation, node N9 corresponds to a first power supply voltage (e.g., VDD), node N10 corresponds to a second power supply voltage (e.g., VSS), node N1 corresponds to an input signal (e.g., IN), and node N8 corresponds to an output signal (e.g., OUT). Transistor M1 is selectively activated in response to the clock signal (CLK) such that a low value of CLK deactivates transistor M1. The gate of transistor M1 is discharged to a circuit ground (e.g., VSS) via transistors M7 and M4, while the full supply voltage (VDD-VSS) is applied across capacitor C1 through transistors M3 and M6. Capacitor C1 stores charge during this operating phase, which will be used as a power source when transistor M1 is activated. Transistors M2 and M5 are arranged to isolate the switch from capacitor C1 while it is charging.

When the clocks signal (CLK) transitions to a high state, transistor M9 sinks the gate of transistor M5, which permits the stored charge on capacitor C1 to flow to the switching gate that is formed on node N2 such that transistors M1 and M2 are both activated. While transistors M1 and M2 are active, the input voltage at node N1 is shifted. M2 enables node N2 to track the input voltage (IN) shifted by the supply voltage (e.g., VDD), keeping the gate-source voltage constant regardless of the input signal. The body (n-well) of transistor M5 is tied to its source such that latch-up is suppressed.

Figure 5A:
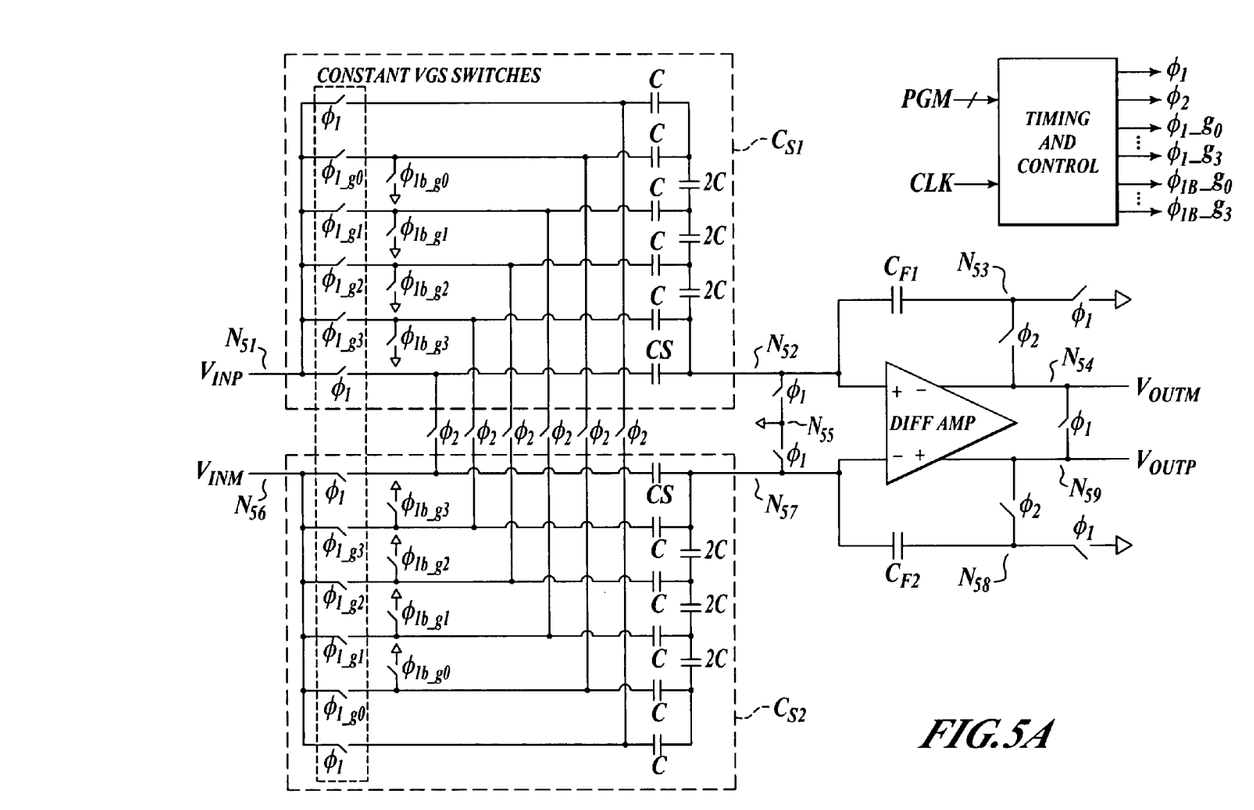
FIG. 5A is a detailed schematic diagram of another differential switched capacitor PGA circuit in accordance with the present disclosure.

FIG. 5A is a detailed schematic diagram of another differential switched capacitor PGA circuit in accordance with the present disclosure. The differential switched capacitor PGA circuit includes: a differential amplifier circuit (DIFF AMP), two feedback capacitor circuits (CF1 and CF2), two sampling capacitor circuits (CS1 and CS2), a multiplicity of switching circuits, and a timing and control circuit.

An input signal is applied across nodes N51 and N56 as signal VINP, VINM. The differential amplifier (DIFF AMP) includes a non-inverting input that is coupled to node N52, an inverting input that is coupled to node N57, a non-inverting output that is coupled to node N59 and an inverting output that is coupled to node N54. Sampling capacitor circuit CS1 is coupled between node N51 and node N52. Sampling capacitor circuit CS2 is coupled between node N56 and node N57. Each of the sampling capacitor circuits corresponds to a C-2C capacitor array similar to that described previously with respect to FIGS. 2B and 3A. Feedback capacitor CF1 is coupled between node N52 and node N53. Feedback capacitor CF1 is coupled between node N57 and node N58. A first set of switching circuits that are responsive to the first control signal ($\phi$1) is coupled between node N52, N52 and N57 in a similar manner to switching circuits and S23 and S24 from FIG. 2B. A second set of switching circuits that are responsive to the second control signal ($\phi$2) is coupled between the two sampling capacitor circuits similar to switching circuit S22 of FIG. 2B. A third set of switching circuits is coupled between nodes N53 and N54, and arranged in a similar manner as switching circuits S25 and S26 of FIG. 2B. A fourth set of switching circuits is coupled between nodes N58 and N59, and arranged in a similar manner as switching circuits S28 and S29 of FIG. 2B. Another switching circuit is coupled between nodes N54 and N59, and arranged to operate similar to switching circuit S27 of FIG. 2B.

The circuits of FIGS. 2B, 3A, and 4 are combined into the PGA circuit shown in FIG. 5A. The combination of the circuits provides for the use of the "constant Vgs" switch for all of the critical switches along the left side of the diagram. These switches are gated with the appropriate gain control bits from a timing and control circuit that are clocked on a sampling phase ($\phi$1). The grounding switches to the right of the input switches are clocked on $\phi$1 also, but are gated with the inverse of the gain control bits. The C-2C capacitor circuit arrays are configured according to the selected gain setting. During the amplification phase (φ2), charge stored from the sampling phase is redistributed with the feedback capacitor circuits are previously described. The output of the differential amplifier circuit (DIFF AMP) corresponds to signals VOUTP and VOUTM.

Figure 5B:
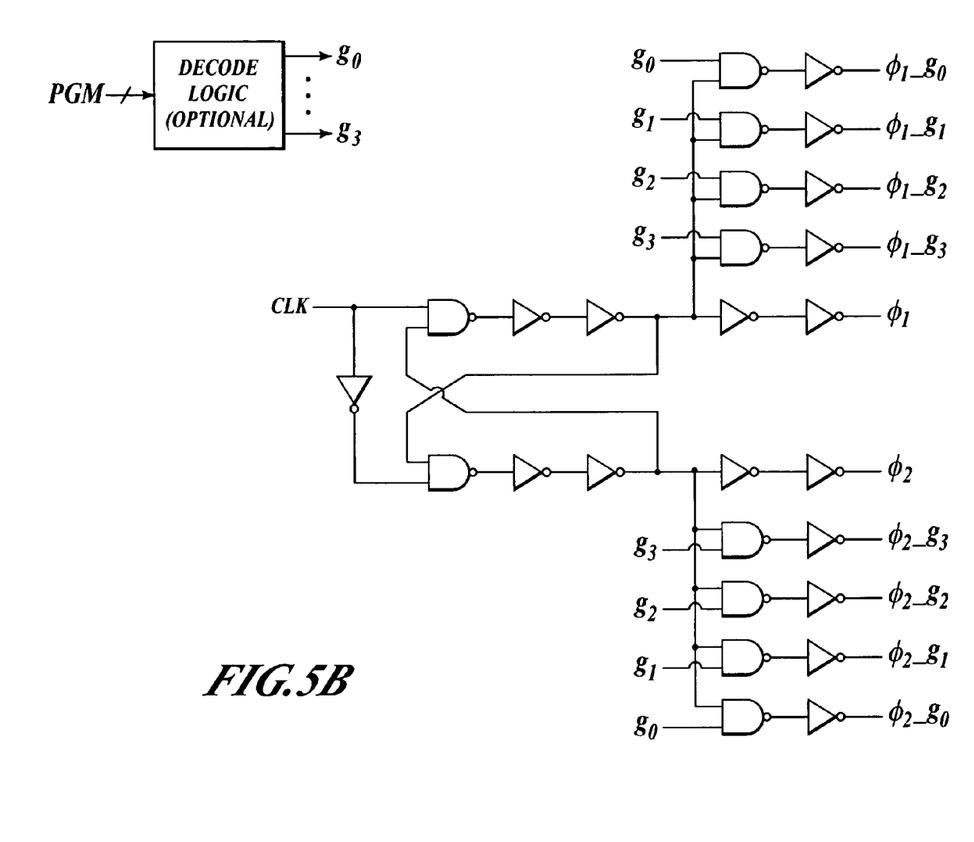
FIG. 5B is a schematic diagram of a timing and control circuit that may be employed by the PGA circuit from FIG. 5A, in accordance with the present disclosure.

FIG. 5B is a schematic diagram of a timing and control logic that may be employed by the PGA circuit from FIG. 5A, in accordance with the present disclosure. An optional decoder circuit is arranged to provide switch control signals g0-g3 in response to the programming signal (PGM). The timing block is a two-phase non-overlapping clock generator, including clocking phases (φ1 and φ2. The non-overlapping clock signals are gated with the various control signals to provide switch control signals φ1_g0-φ1_g3, and switch control signals φ2_g0-φ2_g3. The described control signals are arranged to provide non-overlapping control of the gain adjustments for the C-2C arrays in the sampling capacitor circuits described above.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A switched capacitor programmable gain amplifier (PGA) that is arranged to provide an output signal that is gain scaled from an input signal, the switched capacitor PGA comprising:
   a differential amplifier circuit that includes a first input terminal, a second input terminal, and an output terminal;
   a first capacitor circuit that is coupled between the input signal and the first input terminal, and arranged to provide a nominal capacitance for an adjustable sampling capacitor circuit;
   a second capacitor circuit that is coupled between a first intermediate node and the first input terminal, and arranged to provide an offset capacitance for the adjustable sampling capacitor circuit;
   a constant VGS switching circuit that is arranged to selectively couple the first intermediate node to the input signal in response to a gain control signal such that the effective capacitance is determined by the nominal capacitance and the offset capacitance;
   a first switching circuit that is arranged to selectively couple the first intermediate node to a predetermined voltage in response to an inverse of the gain control signal;
   a second switching circuit that is arranged to selectively couple the first input terminal to a predetermined voltage during a sampling phase of the switched capacitor PGA;
   a third switching circuit that is arranged to selectively configure the adjustable sampling capacitor circuit for an amplification phase of the switched capacitor PGA;
   a feedback capacitor circuit that is coupled between the first input terminal and a feedback intermediate node;
   a fourth switching circuit that is arranged to selectively couple the feedback intermediate node to the predetermined voltage during the sampling phase of the switched capacitor PGA; and
   a fifth switching circuit that is arranged to selectively couple the feedback intermediate node to the output terminal of the differential amplifier circuit during the amplification phase of the switched capacitor PGA.

2. The switched capacitor PGA of claim 1, wherein the adjustable sampling capacitor circuit is configured as one of: a C-2C capacitor array, and a modified C-2C capacitor array.

3. The switched capacitor PGA of claim 1, wherein the predetermined voltage corresponds to one of: a reference voltage, a mid-supply voltage, a power supply voltage, and a ground return voltage.

4. The switched capacitor PGA of claim 1, further comprising a non-overlapping clock generator circuit that is arranged to provide control signals sufficient to prevent the simultaneous actuation of the constant VGS switching circuit and the first switching circuit.

5. The switched capacitor PGA of claim 1, further comprising a timing and control circuit that is arranged to provide at least one of: a first timing control signal that is active during the sampling phase, a second timing control signal that is active during the amplification phase, the gain control signal, and the inverse of the gain control signal.

6. The switched capacitor PGA of claim 1, the constant VGS switching circuit comprising: a first transistor that is couple between the input signal and the first intermediate node and responsive to a gate control terminal, a second transistor that is coupled between the input signal and a second intermediate node and responsive to the gate control terminal, a capacitor charging circuit that is arranged to store charge from a supply voltage during a first clocking phase, and a gate voltage control circuit that is arranged to selectively couple the stored charge to the gate control terminal such that the gate control terminal has a voltage that tracks the supply voltage and the input signal.

7. The switched capacitor PGA of claim 1, the adjustable sampling capacitor circuit further comprising:
   a third capacitor circuit that is coupled between a second intermediate node and the first input terminal, and arranged to provide a second offset capacitance for the adjustable sampling capacitor circuit;
   a second constant VGS switching circuit that is arranged to selectively couple the second intermediate node to the input signal in response to a second gain control signal such that the effective capacitance is also determined by the second offset capacitance; and
   a sixth switching circuit that is arranged to selectively couple the second intermediate node to the predetermined voltage in response to an inverse of the second gain control signal.

8. The switched capacitor PGA of claim 7, the third switching circuit comprising: a seventh switching circuit that is coupled to the first intermediate node, and an eighth switching circuit that is coupled to the second intermediate node, wherein the seventh switching circuit and the eighth switching circuit are activated during the amplification phase.

9. The switched capacitor PGA of claim 1, wherein the differential amplifier circuit comprises one of: a single-ended amplifier circuit, and a fully-differential amplifier circuit.

10. The switched capacitor PGA of claim 1, further comprising a sixth switching circuit that is arranged to selectively initialize the output of the differential amplifier to a known condition during the sampling phase.

11. The switched capacitor PGA of claim 1, further comprising:
   a third capacitor circuit that is coupled between the second input signal and the second input terminal, and arranged to provide a second nominal capacitance for a second adjustable sampling capacitor circuit;

a fourth capacitor circuit that is coupled between a second intermediate node and the second input terminal, and arranged to provide a second offset capacitance for the second adjustable sampling capacitor circuit;

a second constant VGS switching circuit that is arranged to selectively couple the second intermediate node to the second input signal in response to the gain control signal such that the effective capacitance of the second adjustable sampling capacitor circuit is determined by the nominal capacitance and the offset capacitance;

a sixth switching circuit that is arranged to selectively couple the second intermediate node to the predetermined voltage in response to the inverse of the gain control signal;

a seventh switching circuit that is arranged to selectively configure the second adjustable sampling capacitor circuit for the amplification phase of the switched capacitor PGA;

a second feedback capacitor circuit that is coupled between the second input terminal and a second feedback intermediate node;

an eighth switching circuit that is arranged to selectively couple the second feedback intermediate node to the predetermined voltage during the sampling phase of the switched capacitor PGA; and a ninth switching circuit that is arranged to selectively couple the second feedback intermediate node to a second output terminal of the differential amplifier circuit during the amplification phase of the switched capacitor PGA.

12. An apparatus that is arranged to provide an output signal that is gain scaled from an input signal that is provided to an input signal terminal, the apparatus comprising:

a differential amplifier circuit that includes a first amplifier input terminal, a second amplifier input terminal, and an amplifier output terminal, wherein the second amplifier input terminal is coupled to a signal return path;

an adjustable sampling capacitor circuit that is coupled between the first amplifier input terminal and the input signal terminal, wherein the adjustable sampling capacitor circuit comprises:

a plurality of selectable unit capacitor circuits that are each selectable in response to a respective gain control signal, wherein each of the plurality of selectable unit capacitor circuits includes a first capacitor terminal and a second capacitor terminal;

a plurality of constant VGS switching circuits, wherein each of the plurality of constant VGS switching circuits is coupled between the input signal terminal and a respective one of the first capacitor terminals;

a plurality of signal return switching circuits, wherein each of the plurality of signal return switching circuits is coupled between the signal return path and a respective one of the first capacitor terminals;

a plurality of double unit capacitor circuits that are coupled between adjacent ones of the second capacitor terminals;

a terminating unit capacitor circuit that is coupled between the input signal terminal and a last one of the second capacitor terminals; and a nominal sampling capacitor circuit that is coupled between the input signal terminal and the first amplifier input terminal, wherein the first amplifier input terminal corresponds to a first one of the second capacitor terminals;

a feedback capacitor circuit that is coupled between the first amplifier input terminal and an intermediate feedback node;

a sample switching circuit that is configured to: selectively couple the first amplifier input terminal to the signal return path during a sampling phase; and a feedback switching circuit that is configured to selectively couple the intermediate feedback node to: the amplifier output terminal during an amplification phase, and the signal return path during the sampling phase.

13. The apparatus of claim 12, further comprising a second sample switching circuit that is arranged to selectively couple each of the plurality of first capacitor terminals to the signal return path during the amplification phase.

14. The apparatus of claim 12, wherein the signal return path corresponds to one of: a reference voltage, a mid-supply voltage, a power supply voltage, and a ground return voltage.

15. An apparatus that is arranged to provide an output signal that is gain scaled from an input signal that is provided to across a first input signal terminal and a second input signal terminal, the apparatus comprising:

a differential amplifier circuit that includes a first amplifier input terminal, a second amplifier input terminal, a first amplifier output terminal and a second amplifier output terminal;

a first adjustable sampling capacitor circuit that is coupled between the first amplifier input terminal and the first input signal terminal;

a second adjustable sampling capacitor circuit that is coupled between the second amplifier input terminal and the second input signal terminal, wherein each of the first adjustable sampling capacitor circuit and the second adjustable sampling capacitor circuit comprises:

a plurality of selectable unit capacitor circuits that are each selectable in response to a respective gain control signal, wherein each of the plurality of selectable unit capacitor circuits includes a first capacitor terminal and a second capacitor terminal;

a plurality of constant VGS switching circuits, wherein each of the plurality of constant VGS switching circuits is coupled between the input signal terminal and a respective one of the first capacitor terminals;

a plurality of signal return switching circuits, wherein each of the plurality of signal return switching circuits is coupled between a signal return path and a respective one of the first capacitor terminals;

a plurality of double unit capacitor circuits that are coupled between adjacent ones of the second capacitor terminals;

a terminating unit capacitor circuit that is coupled between the corresponding input signal terminal and a last one of the second capacitor terminals; and a nominal sampling capacitor circuit that is coupled between the corresponding input signal terminal and the corresponding amplifier input terminal, wherein the first amplifier input terminal corresponds to a first one of the second capacitor terminals;

a first feedback capacitor circuit that is coupled between the first amplifier input terminal and a first intermediate feedback node;

a first sample switching circuit that is configured to selectively couple the first amplifier input terminal to the signal return path during a sampling phase;

a first feedback switching circuit that is configured to selectively couple the first intermediate feedback node to: the first amplifier output terminal during an amplification phase, and the signal return path during the sampling phase;

a second feedback capacitor circuit that is coupled between the second amplifier input terminal and a second intermediate feedback node;

a second sample switching circuit that is configured to selectively couple the second amplifier input terminal to the signal return path during a sampling phase; and a second feedback switching circuit that is configured to selectively couple the second intermediate feedback node to: the second amplifier output terminal during an amplification phase, and the signal return path during the sampling phase.

16. The apparatus of claim 15, further comprising a second sample switching circuit that is arranged to selectively couple each of the plurality of first capacitor terminals in the first adjustable sampling capacitor circuit to a corresponding one of the plurality of first capacitor terminals in the second adjustable sampling capacitor circuit to the signal return path during the amplification phase.

17. An apparatus that is arranged to provide an output signal that is gain scaled from an input signal that is provided to an input signal terminal, the apparatus comprising:

a differential amplifier means that includes a first amplifier input terminal, a second amplifier input terminal, and an amplifier output terminal;

an array of unit capacitor means that each include a first capacitor terminal and a second capacitor terminal;

an array of constant VGS switching means that are each coupled between the first amplifier input terminal and a corresponding one of the first capacitor terminals, wherein each of the constant VGS switching means is responsive to a respective gain control signal;

an array of signal return switching means that are each coupled between a signal return path and a corresponding one of the first capacitor terminals, wherein each of the signal return switching means is responsive to a respective inverse gain control signal;

an array of double unit capacitor means that are each coupled between adjacent ones of the second capacitor terminals;

a terminating unit capacitor means that is coupled between the input signal terminal and a last one of the second capacitor terminals;

a nominal sampling capacitor means that is coupled between the input signal terminal and the first amplifier input terminal, wherein the first amplifier input terminal corresponds to a first one of the second capacitor terminals;

a feedback capacitor means that is coupled between the first amplifier input terminal and an intermediate feedback node;

a sample switching means that is configured to: selectively couple the first amplifier input terminal to the signal return path during a sampling phase; and a feedback switching means that is configured to selectively couple the intermediate feedback node to: the amplifier output terminal during an amplification phase, and the signal return path during the sampling phase.

18. A method for providing an output signal that is gain scaled from an input signal that is provided to an input signal terminal, the method comprising:

configuring a C-2C array circuit with at least a first gain control signal;

selectively coupling the input signal to an input side of a unit capacitor circuit in the C-2C array circuit with a constant VGS switching means during a sampling phase when the first gain control signal is asserted;

selectively coupling a signal ground to the input side of the unit capacitor circuit in the C-2C array circuit during the sampling phase when the first gain control signal is deasserted;

coupling the input signal to an input side of a nominal sampling capacitor circuit during the sampling phase such that charge is stored on the nominal sampling capacitor circuit and also stored on the unit capacitor circuit when the first gain control signal is asserted;

configuring the input side of the nominal sampling capacitor circuit and the input side of the unit capacitor circuit to redistribute stored charge with a feedback capacitor circuit during an amplification phase; and providing the output signal with a differential amplifier that is arranged in cooperation with the capacitor circuits to gain scale the input signal.

* * * * *

UNITED STATES PATENT AND TRADEMARK OFFICE
CERTIFICATE OF CORRECTION

PATENT NO. : 7,276,962 B1
APPLICATION NO. : 11/283915
DATED : October 2, 2007
INVENTOR(S) : Loren Justin Tomasi It is certified that error appears in the above-identified patent and that said Letters Patent is hereby corrected as shown below:

Column 3, line 51: "signal (P1" should read -- signal $\varphi 1$ --

Column 6, line 21: "CF - 500 fF, CSN - 500 fF," should read -- CF = 500 fF, CSN = 500 fF, --

Column 6, line 30: "by: $GAIN_{LSB}$ - $CS_{LSB}$ / $CS_{MIN}$ - 31.25fF / 500 fF - 0.0625 V/V" should read -- by: $GAIN_{LSB}$ = $CS_{LSB}$ / $CS_{MIN}$ = 31.25fF / 500 fF = 0.0625 V/V --

Signed and Sealed this

Eighteenth Day of March, 2008

JON W. DUDAS
*Director of the United States Patent and Trademark Office*